United States Patent [19]

Wischermann

[11] Patent Number: 5,122,761
[45] Date of Patent: Jun. 16, 1992

[54] DIGITAL PLL INCLUDING CONTROLLABLE DELAY CIRCUIT

[75] Inventor: Gerhard Wischermann, Weiterstadt, Fed. Rep. of Germany

[73] Assignee: BTS Broadcast Television Systems GmbH, Darmstadt, Fed. Rep. of Germany

[21] Appl. No.: 647,911

[22] Filed: Jan. 30, 1991

[30] Foreign Application Priority Data

Feb. 12, 1990 [DE] Fed. Rep. of Germany ....... 4004195

[51] Int. Cl.⁵ .......................................... H03L 7/085
[52] U.S. Cl. .................................. 331/1 A; 328/155; 331/17; 331/25
[58] Field of Search ...................... 331/1 A, 17, 25, 27; 328/155; 455/260; 375/120

[56] References Cited

U.S. PATENT DOCUMENTS 4,475,220 10/1984 Mattei et al. ................... 331/1 A X Primary Examiner—Siegfried H. Grimm
Attorney, Agent, or Firm—Frishauf, Holtz, Goodman & Woodward

[57] ABSTRACT

A digital oscillator clocked by clock pulses (T) produces an output rectangular wave, the phase of which is controlled by a magnitude supplied to a D register (8'). The most significant bits of that magnitude are derived from the contents of a counter (4) clocked by the output signal (S), while some less significant bits of that magnitude, representing the progression of equal fractions of the period of the output wave are generated by a combination of the undelayed output wave and at least one delayed output wave which combination is stored at intervals of the reference frequency to which the oscillator is locked. That stored combination is converted from a Gray code to a binary code for compatibility with the counter state. The converted additional bits also control a multiplexer which selects the correspondingly delayed reference frequency signal for clocking a D register (15) which is loaded with the counter content and the converted additional bits. The resulting magnitude is processed in a known way to provide a suitably timed control magnitude input to the digital oscillator.

4 Claims, 3 Drawing Sheets

DIGITAL PLL INCLUDING CONTROLLABLE DELAY CIRCUIT

This invention concerns an apparatus system for generating a signal locked to a reference signal, in which a controllable digital oscillator has an input connected to a source of a clock pulse signal and another input connected to a source of a control magnitude signal which sets the ratio between the clock pulse signal and the output signal. The control magnitude signal is produced by a counter clocked by the oscillator output signal. The counter is interrogated at intervals controlled by the reference signal.

BACKGROUND AND PRIOR ART

Circuit systems for generating signals locked to reference signals have long been known in which the frequency of an oscillator is regulated by means of a phase-locked loop (PLL). In such systems a phase comparison circuit is provided to which the reference signal is supplied at one input and the output signal of the system is supplied at another input. It is frequently necessary to generate a signal of which the frequency is a multiple of the frequency of the reference signal. In such cases a frequency divider is provided between the output of the controllable oscillator and the phase comparison circuit. Such circuits are utilized, for example, for the digital processing of video signals that are present in analog form, more particularly for generating a sampling signal that is locked in frequency and phase with the horizontal synchronizing signal of the video signal.

It is also known to implement such circuits in digital circuit technology, in which case the output signal of the oscillator clocks a counter of which the content is interrogated at the rate of the reference signal. The counter's output, as further processed, is supplied as input magnitudes to a digitally controllable oscillator. The accuracy of the digital PLL circuits, however, is limited to one period of the signal to be generated, because of time and amplitude quantization.

SUMMARY OF THE INVENTION

It is an object of the present invention to provide an apparatus system for generating a signal locked to a reference signal in which a greater degree of phase control is possible.

Briefly, from the signal generated by the system and from the reference signal there is derived a digital signal that takes on two, four, eight, or more different values in succession during each period of the signal generated by the system. The reference signal is delayed by a controllable number of equal fractions of a period of the signal generated by the system, selected in response to the value of the digital signal just mentioned. The delayed reference signal is used to interrogate both the digital signal just mentioned, as one or more least significant bits, and also, as more significant bits, the state of a counter continuously advanced by the output signal of the system. The successive values registered by those interrogations are processed to supply to the digital oscillator a control magnitude representative both of phase information and of the ratio of the signal generated by the system to the clock pulse signal supplied to the digital oscillator.

The apparatus system of the invention has the advantage that a substantially more precise phase control is possible compared to the known locked oscillator circuits and this is accomplished with only a slightly supplementary manufacturing expense. The apparatus system of the invention consists essentially of digital components which are easily provided as integrated circuit components.

Although a preferred field of application for the apparatus system of the invention is the field of digital video technology, there is no reason for limiting the applicability of the invention to that field. Just as the previously known phase-locked oscillators had a wide variety of applications, the apparatus system of the present invention is expected to have a similarly wide variety of applications.

It is particularly convenient for the generated oscillator signal to be of meander shape and to supply it both undelayed and delayed by ¼ of the signal period to a D register which is clocked by the reference signal and then to convert the successive values stored in the D register from a Gray code to a binary code for storage in another D register connected with control inputs of a controllable delay chain, as well as connected for the output of the binary digital signal to be added as less significant bits. These less significant bits in one embodiment form a 2-bit signal having four values per cycle. By also supplying the oscillator output signal delayed by ⅛ and ⅜ of the signal period to the first D register, a 3-bit digital signal can be provided for a still more precise phase control of the output signal, and so on.

BRIEF DESCRIPTION OF THE DRAWINGS

The invention is further described by way of illustrative example with reference to the annexed drawings, in which.

In the several figures, the same parts are identified by the same reference numerals.

DESCRIPTION OF THE ILLUSTRATED EMBODIMENTS

Figure 1:
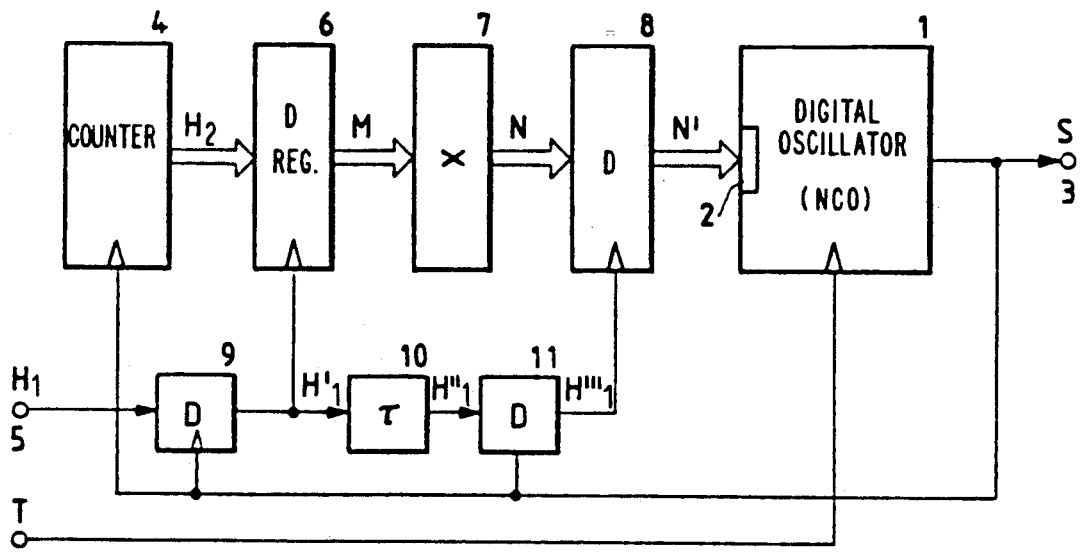
FIG. 1 is a block circuit diagram of a known digital phase-locked loop (PLL) circuit.

For generating the signal S in the heretofore known way, the circuit diagram of FIG. 1 shows a system built around the digital oscillator 1 which is clocked by a clock signal T. Such digital oscillators are likewise well known and do not need to be further explained in connection with the present invention. A digital oscillator particularly advantageous for use in the apparatus system of the invention described further below is disclosed in copending U.S. patent application Ser. No. 07/639,965, filed Jan. 11, 1991, and claiming the priority of German patent application No. P 40 01 555, the contents of which are hereby incorporated by reference.

The digital oscillator 1 has a control input 2 to which there is supplied, as a setting magnitude, a digital signal of a value representative of the ratio of the respective frequencies of the clock signal T and the output signal S, which is made available at the output 3.

In order to form a phase-locked loop, the output signal S is supplied to the clock input of a counter 4 which has a capacity corresponding to the ratio of the respective frequencies of the signal S and a reference signal $H_1$ supplied at a terminal 5. In order to provide an output signal S that is suitable as a sampling signal for a circuit for digital processing of video signals, the frequency of the signal S may be, for example, a frequency which is the television line frequency multiplied by 1728. In that case the counter 4 is designed for a counting range from 0 to 1727, for which 11 binary places are required. The 11-bit counter content $H_2$ is interrogated at the horizontal frequency to produce the output signal M by means of a D register 6. The signal M is supplied to a digital multiplier 7 which has a settable multiplier constant, typically a power of 2, which makes possible the setting of the loop amplification. The value N obtained at the output of the circuit 7 is then interrogated by a second D register 8 at the frequency of the clock signal T and is supplied as the value N' to the control input 2 of the digital oscillator 1.

The D register 6 then serves as a phase comparison circuit, because the counter state which is present upon the appearance of a pulse of the signal $H_1$ represents a measure for the phase shift between the signals S and $H_1$.

In the circuit of FIG. 1 there are, however, three different time frames, namely those of the clock signal T, of the output signal S and of the reference signal $H_1$. In order nevertheless to obtain trouble-free operation of the circuit, the reference signal $H_1$ is interrogated by a D flipflop (register) by means of the output signal S, thus producing a signal $H_1'$ that corresponds, with reference to the relative period and a "coarse" phase position, to the reference signal $H_1$. The "fine" phase position of the reference signal $H_1$ falls in the time frame of the signal S The D register 6 is clocked with this signal $H_1'$. After a constant delay provided at 10 in FIG. 1 the delayed signal $H_1''$ is interrogated by the signal S in still another D flipflop 11, as a result of which a line frequency signal $H_1'''$ is produced which falls in the time frame provided by the clock signal T. The D register 8 is then clocked with the signal $H_1'''$, also that the setting magnitude is supplied in a manner adjusted timewise to the digital oscillator 1.

Since a value of $H_2$ always lies at the inputs of the D register 6 during a full period of the signal S, the control accuracy of the PLL circuit is limited to a period of the signal S. This appears in phase fluctuations of the signal S with reference to the reference signal $H_1$. The cause of these fluctuations is, in the last analysis, the amplitude and time quantization that takes place in the phase comparison. By means of the D register 6 a phase deviation between $H_2$ and $H_1$ can be detected only when it is greater than a full period of the signal S.

Figure 2:
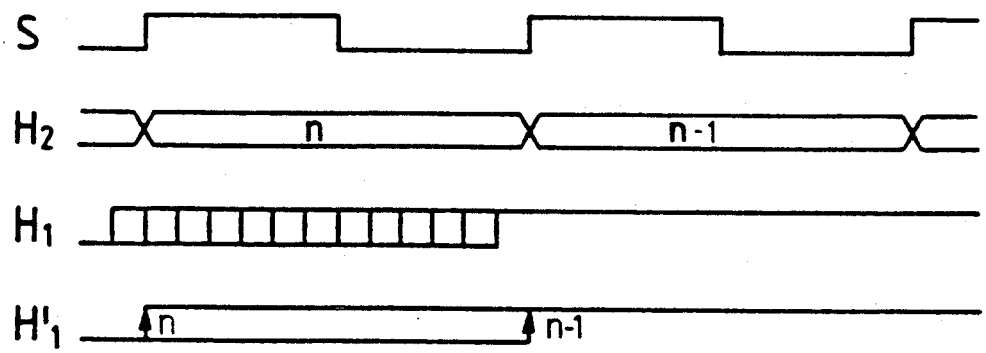
FIG. 2 is a timing diagram showing, on the same time scale, various signals present in the PLL circuit of FIG. 1.

For further explanation of this disadvantage reference is made to FIG. 2. The time scale of the diagrams shown in FIG. 2 is chosen in such a way that about two periods of the signal S are shown, while only one positive flank of the reference signal $H_1$ is visible, which can occur in $H_1$ in any of the several phase positions relative to the signal S shown in that line of the FIG. 2 diagram. In the example here explained, the counter 4 can be assumed to be a backwards counter, the content $H_2$ of which is n at the time of the first pulse of the signal S and is decremented later to n−1. So long as the positive flank of the reference signal $H_1$ occurs before the first illustrated positive flank of the signal S, the clocking of the D register 6 (FIG. 1) by the signal $H_1'$ loads that D register with the count content n. Only when, as the result of later appearance of $H_1$, the still later rise of $H_1'$ coincides with the following positive flank of the signal S does the count state n−1 begin to be loaded into the D register 6.

In order to reduce this inaccuracy of control, it is in principle possible to generate a signal S of higher frequency. For the application mentioned here, however, that would be a signal of a frequency in the range of 100 MHz, which leads to a substantially more expensive implementation, for example with ECL circuits, special circuit board technologies, and a high use of conducting paths as well as the occurrence of problems of electromagnetic radiation.

Figure 3:
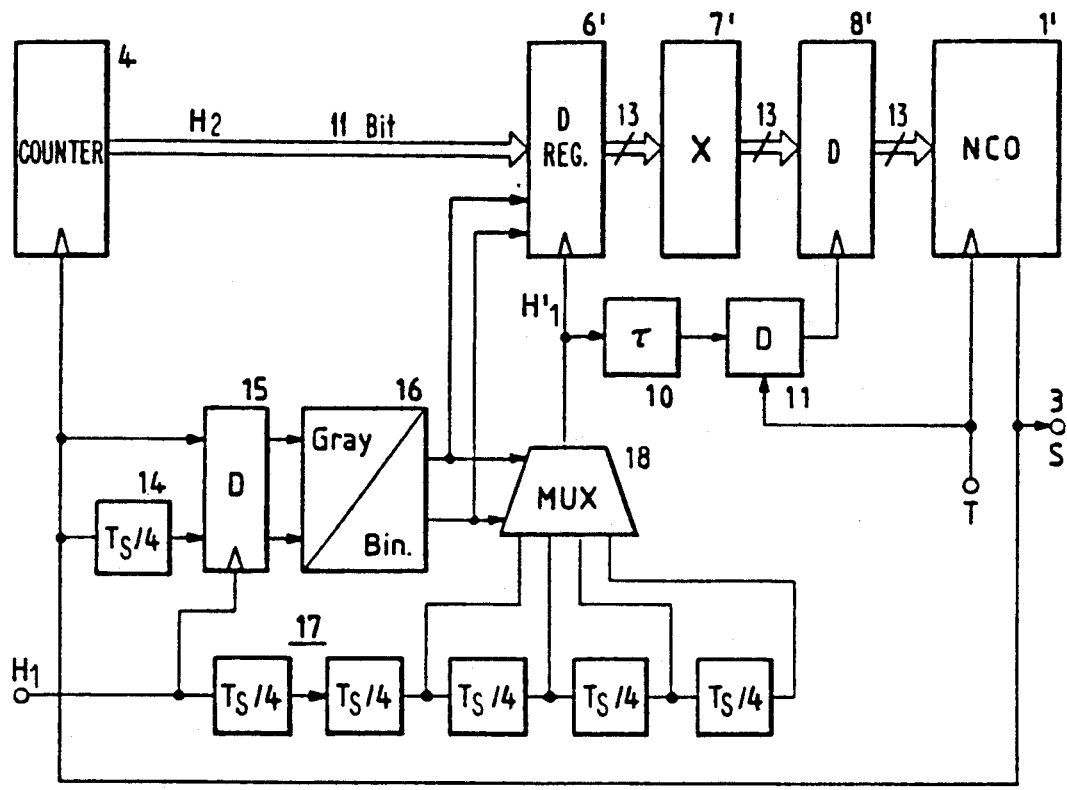
FIG. 3 is a block circuit diagram of an apparatus system according to the present invention.

The embodiment shown in FIG. 3, like that of FIG. 1, contains a digital oscillator. By way of phase-locked loop it likewise contains a counter 4, a first D register, an amplification setting stage and a second D register. The controllable oscillator, as well as the D registers and the amplification setting circuit in this case, however, are designed for digital signals having a width of 13 bit places and for that reason they are designated in FIG. 3 as 1', 6', 7' and 8' respectively.

Figure 5:
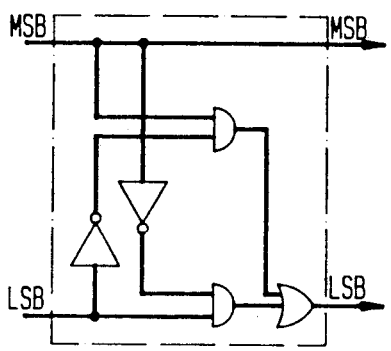
FIG. 5 is a logic diagram of the code converter of the circuit of FIG. 3.

The supplementary bit places, both of least significance, run through four possible values during every period of the signal S. To make that possible, the signal S is supplied on the one hand directly and on the other hand after a delay of $T_S/4$ in the unit 14 to a D register 15. The signal S and the delayed signal S' together generate a two-place digital signal conforming to a Gray code, the values of which are interrogated by the pulses $H_1$. For the supplementary bit places at the input of D register 6', however, a normal binary code is necessary. For this reason, a code converter 16 is connected to the outputs of the D register 15. The code converter 16 can be constituted in a simple way by means of a corresponding logic circuit, as shown in FIG. 5, or an equivalent ROM. The interrogation signal $H_1'$ is produced by means of a controllable delay device which consists of a delay chain 17 and a multiplexer 18. The delay chain 17 is composed of five delay elements each providing a delay of $T_S/4$, of which the first two serve to equalize the propagation time between the D register 15 and the D register 6', while the outputs of the other delay units are connectable in a manner dependent on the output signal B of the code converter 16, through the multiplexer 18, to the clock input of the D register 6'. The delayed horizontal frequency signal $H_1'$ is also supplied to the delay element 10 and further processed as already shown in connection with FIG. 1.

Figure 4:
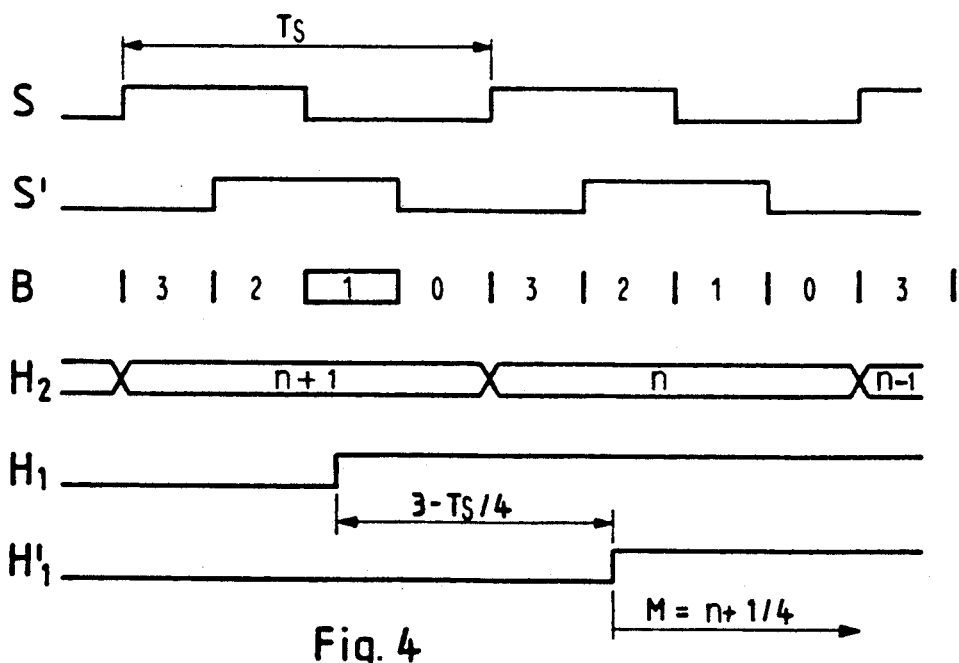
FIG. 4 is a timing diagram showing various signals on the same time scale which are present in the apparatus system shown in FIG. 3.

FIG. 4 shows the signals appearing in the circuit of FIG. 3. It is evident from the first two lines of FIG. 4 that the signal S and the delayed signal S' make possible a division into four equal parts of the period $T_S$. The value of the two least significant bits thereby generated and processed in the code converter 16 are counted down, at the resulting four-fold frequency, from 3 to 0. When a leading flank of the signal $H_1$ appears, the values present at the inputs of the D register 15 are taken over (as code-converted) into the D register 6'. In the illustrated moment this signal B (FIG. 4) produced by the code conversion has the two-bit binary code value 1. The multiplexer is thereby controlled in such a way that the signal $H_1'$ is delayed by $3.T_S/4$ with respect to $H_1$. At this moment the count content n is present at inputs of the D register 6' and at the same time likewise the value 1 stored in the D register 15. Thus the value $M=n+\frac{1}{4}$ is taken into the D register 6'. This value is further processed as described in connection with FIG. 1.

If $H_1$, for example, appeared half a period $T_s$ later, the two-bit binary value would be 3, the delay would be $5.T_S/4$ and the initial value of the D register 6' serving as phase comparator would be $M=(n-1)+\frac{3}{4}$, thus 0.5 smaller than the phase position shown in FIG. 4. The phase shift of a half period of $T_S$ is thus correctly recognized by the phase comparator. Each binary unit value of B is equal to one quarter of a unit of M.

In the illustrative embodiment shown in FIG. 3 the residual phase fluctuation or jitter is less than $\pm 5$ ns for a frequency $f_S$ of 27 MHz.

Instead of the four-fold increase of accuracy provided by the illustrated example, there can be provided within the scope of the invention either a smaller or a greater increase in accuracy, the increase in accuracy to be expected being $2^n$ in accordance with the increase of the number of the bit places, which is n, of the setting magnitude M, N, N' of the digital oscillator. For raising the accuracy by the factor 8, as shown in FIG. 6 there are additionally needed delay circuits 14' and 14" providing delays respectively of $T_S/8$ and $3T_S/b$ in addition to the delay circuit 14 and of course the D register 15, the code converter 16, the delay chain 17 and the multiplexer 18 of FIG. 3 would then be correspondingly modified.

Figure 7:
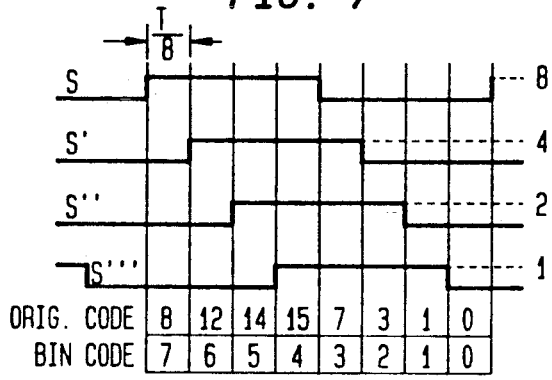
FIG. 7 is a diagram explaining the code conversion produced in the ROM 26 of FIG. 6.
Figure 6:
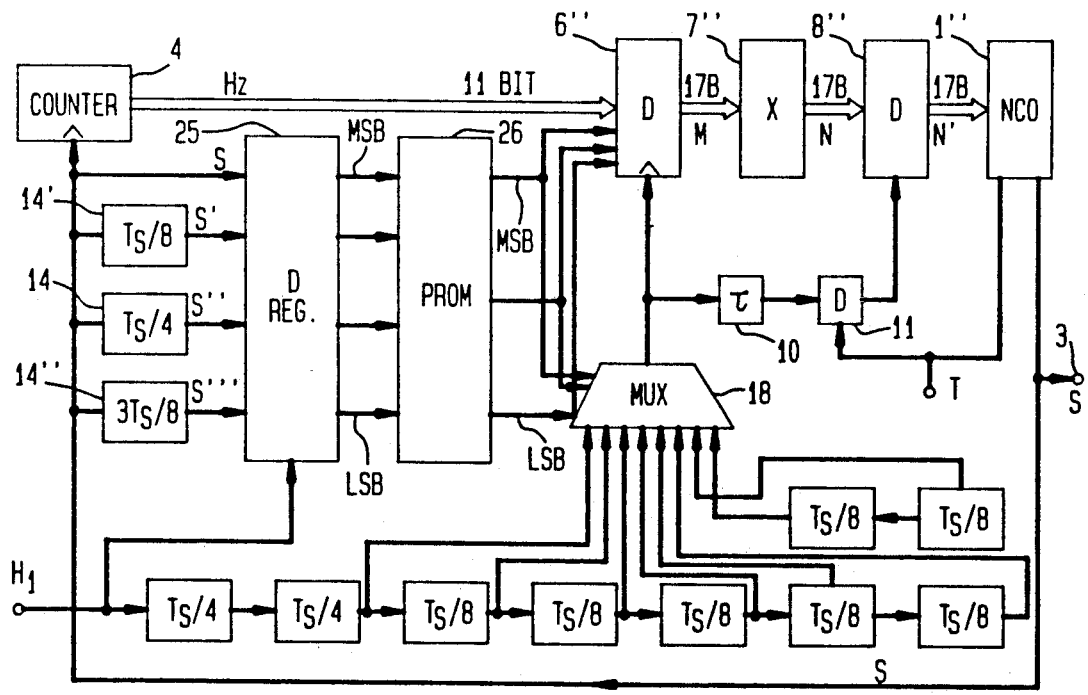
FIG. 6 is a block circuit diagram of an apparatus system of the invention showing how the principle of the system of FIG. 3 can be extended to provide greater phase locking accuracy.

In FIG. 6, the D register 25 accordingly has 4 one-bit inputs and 4 corresponding outputs. The PROM 26, which provides the code conversion has 4 address input bits but only three bits of output, shown by individual lines going to the multiplexer 18' and the D register 6". FIG. 7 shows that the input code, which may be called a staircase code, has some resemblance to the 2-bit Gray code, changing only one bit place at a time. The output of the PROM 26 requires only 3 bit places.

In FIG. 7 there are shown one above the other the signal S, which is undelayed, and delayed signals S', S" and S'41 all of which are identified at the left of FIG. 7. The bit values (S being the most significant) are shown at the right of FIG. 7. Directly beneath the four waveforms shown in FIG. 7 there is given the staircase code represented by the four bits having the values shown at the right of FIG. 7. Directly under that code is the desired binary code for controlling the multiplexer 18' and for the added less significant bits for the D-register 6". That conversion is put into the PROM 26 as a so-called look-up table.

Although the invention has been described with reference to particular illustrative examples, it will be understood that modifications and variations are possible within the inventive concept.

I claim:

1. An apparatus system for generating a signal (S) locked to a reference signal ($H_1$) comprising a controllable digital oscillator (1) having a first input connected to a source of a clock pulse signal (T) and a second input connected to a source of a digital control magnitude signal (N') and means including a counter for deriving said control magnitude by interrogating said counter for its content in a manner making said control magnitude representative of the ratio of the signal generated by the system to said reference signal, characterized in that means (14, 15, 16) are provided for deriving, from the signal (S) generated by the system and said reference signal ($H_1$), a digital signal (B) that takes on a cycle of predetermined different values in succession during each period of said signal (S) generated by the system;

means including a controllable delay circuit (17, 18) are provided for delaying said reference signal by a controllable number of equal fractions of a period of said signal (S) generated by the system selected in response to said digital signal (B), and means connected to and responsive to an output of said delay circuit supplying a delayed reference signal ($H_1'$) for interrogating simultaneously the content of said counter (4) and said digital signal (B) and supplying the result of said interrogation with said digital signal (B) supplied as at least one supplementary less significant bit for said counter content for derivation therefrom of said digital control magnitude signal (N') for said digital oscillator (1).

2. The apparatus system of claim 1, wherein means (14) are provided for delaying said signal (S) generated by said system for one-quarter of the duration of a period of said signal (S) generated by said system, wherein said signal (S) generated by said system is meander-shaped and is supplied undelayed and delayed by said delaying means for the duration of one-quarter of a period thereof to a first D register (15) having an output and connected for being clocked by said reference signal ($H_1$), and wherein a converter from Gray code to binary code (16) has inputs connected with the outputs of said first D register (15) and having outputs providing said digital signal (B) connected to inputs of a second D register (6') and to control inputs of said controllable delay circuit (17, 18), said second D register (6') being also connected for interrogating the content of said counter (4) and being clocked by said delayed reference signal ($H_1'$), said means (14) for delaying said signal (S) generated by said system, first D register (15) and converter (16) all being components of said means for deriving said digital signal (B) providing cycles of predetermined values.

3. The apparatus system of claim 1, wherein means (14', 14, 14") are provided for delaying said signal (S) generated by said system by $\frac{1}{8}$, $\frac{3}{8}$ and $\frac{1}{4}$ of the duration of a period of said signal (S) so that said signal (S) is made available with each of the several delays as well as undelayed, wherein said signal (S) generated by said system is meander shaped and is supplied undelayed, and delayed by said delaying means at each of said delays, to a first D register (25) having an output and connected for being clocked by said reference signal ($H_1$), wherein a read-only memory (26) programmed as a code converter has its address input connected to the output of said first D register and has an output providing said digital signal (B) that takes on a cycle of predetermined different values in succession during each period of said signal (S) generated by the system, said delaying means, first D register and read-only memory being portions of said means for deriving said digital signal (B) providing cycles of predetermined different values, and wherein a second D register (6') being provided which has an input connected to the output of said read-only memory (26) for obtaining 3 least significant bits for its content, said output of said read-only memory (26) also being connected to a control input of said controllable delay circuit (17, 18), said second D register (6') being also connected for interrogating the content of said counter (4) and being clocked by said delayed reference signal ($H_1'$).

4. The apparatus system of claim 1, wherein said controllable delay circuit (17, 18) comprises a tapped delay chain (17) for said reference signal ($H_1$) and a multiplexer (18) having signal inputs connected respectively to the taps of said delay chain (17) and having at least one control input connected to an output of said means for deriving said digital signal (B), and having an output for supplying said delayed reference signal ($H_1'$) for interrogating simultaneously the content of said counter (4) and said digital signal (B) providing cycles of predetermined values.

* * * * *